United States Patent

Garrigus

Patent Number: 5,569,343
Date of Patent: Oct. 29, 1996

[54] CERAMIC FABRIC REINFORCED FIBER/MICROPARTICLE CERAMIC COMPOSITE

[75] Inventor: Darryl F. Garrigus, Issaquah, Wash.

[73] Assignee: The Boeing Company, Seattle, Wash.

[21] Appl. No.: 537,339

[22] Filed: Jun. 13, 1990

Related U.S. Application Data

[63] Continuation-in-part of Ser. No. 381,498, Jul. 18, 1989, which is a continuation-in-part of Ser. No. 698,496, Feb. 5, 1985, Pat. No. 5,041,321, which is a continuation-in-part of Ser. No. 667,568, Nov. 2, 1984, abandoned.

[51] Int. Cl.$^6$ ............... C03B 29/00; C04B 33/34; B65H 81/00
[52] U.S. Cl. ............... 156/89; 156/176; 156/173; 156/175; 156/221; 156/296; 156/297; 156/298; 156/303.1; 264/109; 264/112; 264/131; 264/139; 264/135; 264/136; 507/178; 162/124
[58] Field of Search ............... 264/29, 109, 112, 264/131, 139, 135, 136; 156/296, 297, 298, 303.1, 89, 171, 173, 175, 221; 507/128

[56] References Cited

U.S. PATENT DOCUMENTS

| | | |
|---|---|---|
| 3,702,279 | 11/1972 | Ardary . |
| 3,819,468 | 6/1974 | Sauder . |
| 3,935,060 | 1/1976 | Blome . |
| 4,238,257 | 12/1980 | Remi . |
| 4,452,832 | 6/1984 | Wrenn, Jr. . |
| 4,743,340 | 5/1988 | Wrenn, Jr. . |
| 4,770,930 | 9/1988 | Wrenn, Jr. . |
| 4,818,448 | 4/1989 | Wrenn, Jr. . |
| 5,041,321 | 8/1991 | Bendig ............... 428/102 |

OTHER PUBLICATIONS

*Japanese Journal of Applied Physics*, vol. 26, No. 5, May 1987, pp. L761–762, "High Tc Superconductivity in Screen Printed Yb—Ba—Cu—O Films", Koinuma, et al.

*Primary Examiner*—Patrick J. Ryan
*Assistant Examiner*—Rich Weisberger
*Attorney, Agent, or Firm*—Fish & Richardson P.C.

[57] ABSTRACT

A ceramic composite is provided comprising ceramic fibers, glass microballoons and/or diatoms, bound together with a ceramic reinforcing cloth with a sol-gel ceramic binder. The composite is particularly useful as a high strength, high temperature insulation material.

11 Claims, 2 Drawing Sheets

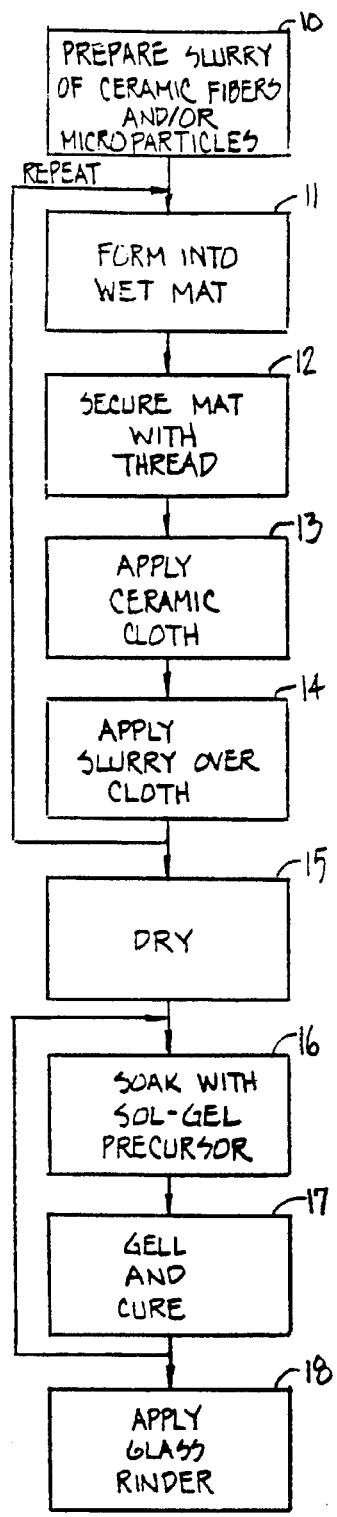
FIG._1.
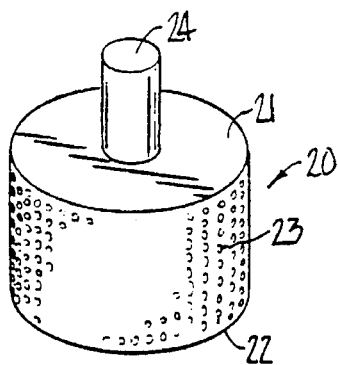
FIG._2A.
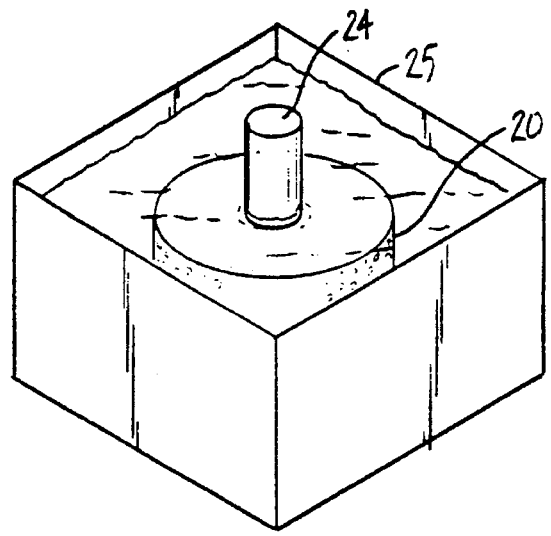
FIG._2B.
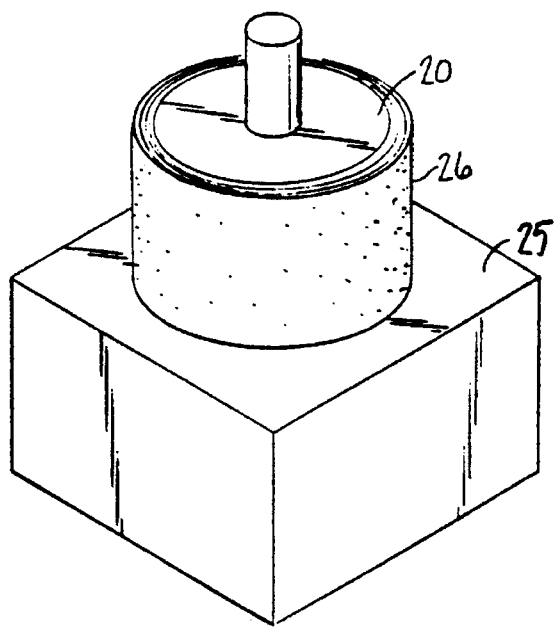
FIG._2C.

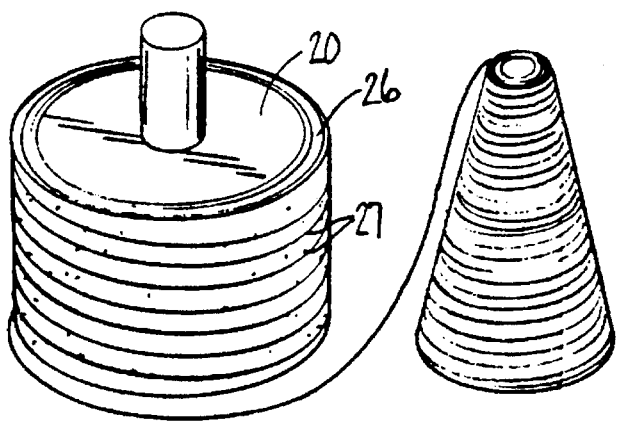
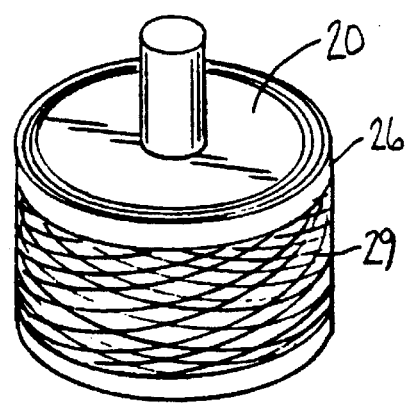
FIG._2D.   FIG._2E.
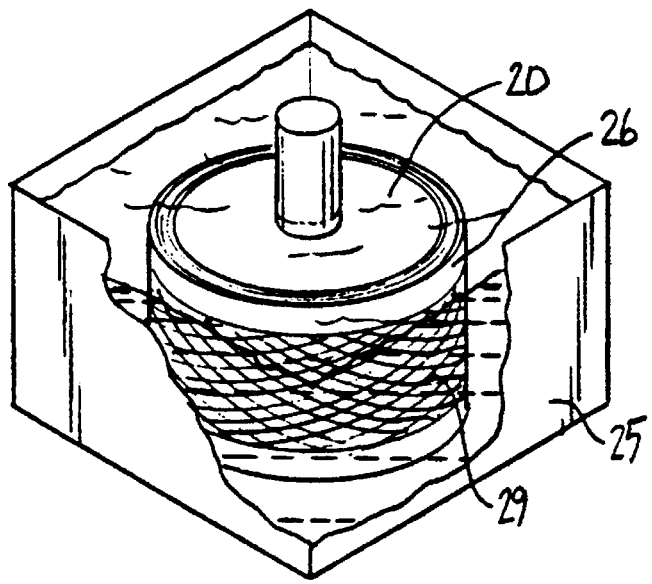
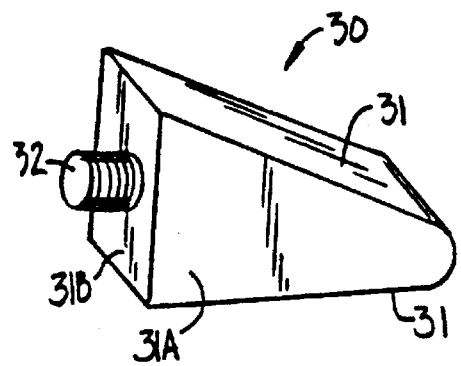
FIG._2F.   FIG._3A.
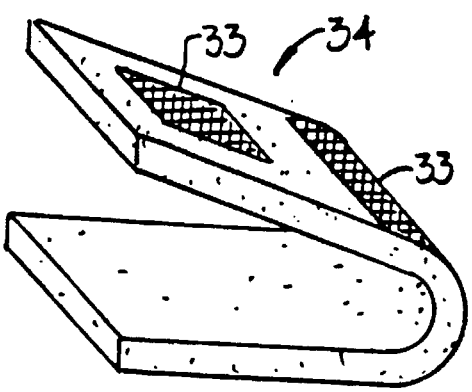
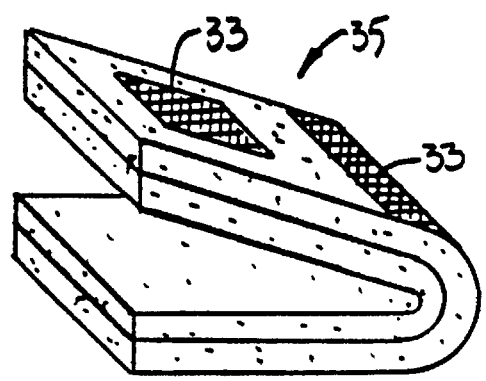
FIG._3B.   FIG._3C.

CERAMIC FABRIC REINFORCED FIBER/MICROPARTICLE CERAMIC COMPOSITE

This application is a continuation-in-part of Application Ser. No. 381,498, filed Jul. 18, 1989, which is incorporated by reference herein, which is a continuation-in-part of Ser. No. 06/698,496, filed Feb. 5, 1985, now U.S. Pat. No. 5,041,321, which is a continuation-in-part of Ser. No. 06/667,568, filed Nov. 2, 1984, now abandon.

Technical Field

This invention relates generally to fiberform ceramic materials, methods of their manufacture and methods of use thereof.

BACKGROUND OF THE INVENTION

In our prior application Ser. No. 381,498 referenced above, there are disclosed fibrous ceramic insulation materials formed by dispersing a suspension of ceramic fibers over a form-defining surface, partially drying the fibers to form a mat, solidifying the mat by first soaking it with a sol-gel ceramic precursor then setting and curing the sol-gel precursor. The present invention is directed to an improvement over that fibrous ceramic, which has improved internal strength, readily tailorable dielectric properties, greater achievable thicknesses as compared to the fiber/microparticle ceramic of our prior applications, and the ability to provide a strong attachment means on the ceramic by overhanging the ceramic cloth.

The present invention also improves on the fiber/microparticle ceramic of our application, filed on an even date herewith, referenced above, which is made from a mixture of ceramic fibers and microparticles by setting the mixture using a sol-gel.

The improvement is provided by using ceramic reinforcement cloth (which may be in tow form), bound within the mat by sol-gel glass bonds. We have found that the rigidized fibrous mats made in accordance with our prior applications consist of fibers which are randomly tangled, most of which are oriented in the x-y plane (the z-axis being aligned with the thickness of the mat). When bound with the sol-gel binder, a fibrous three dimensional network provides a material, with a porosity of about 90–95%. According to our application filed on an even date herewith, the voids between the ceramic fibers may be filled by microballoons and/or diatoms, thus further rigidizing the structure and improving the isotropic structure characteristics of the fibrous material. According to the present invention, the rigidized fibrous mat is strengthened by one or more continuous ceramic reinforcement cloths which are bound by sol-gel glass bonds between layers of the rigidized fiber.

The ceramic composite according to the present invention is characterized not only by improved internal strength of the fibrous ceramic by use of the reinforcement cloth, but also greater thicknesses of the fibrous ceramic may be achieved by virtue of this reinforcement. In addition, the dielectric properties of the ceramic can be tailored by the selected placement of, and by the type of, ceramic cloth.

Another improvement provided by the present invention is that ceramic cloths having larger areas than the fibrous mat may be used, thereby providing peripheral flaps of ceramic cloth extending beyond the fibrous mat which serve as a means for attachment of the fibrous ceramics to one other or to a support to make, for example, insulation plates for furnaces and engines.

SUMMARY OF THE INVENTION

The present invention provides a reinforced ceramic composite comprising a mat comprising intersecting ceramic fibers and/or ceramic microparticles which are bound together in the mat by sol-gel glass bonds; and a continuous ceramic reinforcement cloth having a major portion thereof bound within and to the mat by sol-gel glass bonds. In a preferred embodiment, a portion of the reinforcement cloth extends beyond the peripheral edges of the mat, thereby forming a receiving means for attaching the composite to an attachment means on a support or to an adjacent ceramic plate.

The invention also provides a process for forming such a reinforced ceramic composite comprising the steps of forming at least one slurry comprising ceramic fibers and, optionally, ceramic microparticles or diatoms; molding the slurry to form a soft felt mat having intersecting ceramic fibers and/or microparticles; optionally, securing the mat with glass or ceramic thread; applying a ceramic reinforcement cloth upon the mat; optionally, applying and molding more of the slurry onto the cloth and repeating the steps of molding, securing the mat, and applying another ceramic reinforcement cloth; drying the mat; impregnating the mat with a portion of sol-gel binder; gelling the binder to form bonds at the intersections of the ceramic fibers and microparticles, and at the intersections of the cloth with the fibers so that the mat including the reinforcing cloth are dimensionally stabilized; curing the gelled binder; optionally, repeating the steps of applying the binder, gelling, and curing the binder; and optionally applying a glass binder to the cured, dimensionally stabilized composite.

BRIEF DESCRIPTION OF THE DRAWING

FIG. 1 shows the steps of a preferred method for producing the reinforced ceramic composite according to the invention.

FIG. 2 is an illustration of apparatus and use thereof for making a reinforced cylinder ceramic composite according to the present invention.

FIG. 3 illustrates exemplary reinforced ceramic parts formed by the methods described herein.

DETAILED DESCRIPTION OF THE INVENTION

One component of the ceramic composite according to the present invention is ceramic fiber. Ceramic fibers are known and many are commercially available. Preferably the ceramic fibers will be alumino-silicate fibers, but other fibers may be utilized including, but not limited to, fibers of silica, alumina, boroaluminasilica (commercially available under the trademark Ultrafiber®440 from 3-M Company), zirconia, silicon nitride, and mixtures thereof. The fibers are available in various dimensions, usually from about 0.3 to 4 inches in length (the longest dimension of the fiber) and about 1 to 10 microns in diameter. It should be realized that the dimensions of the fibers can generally be tailored to meet the physical characteristics which are desired in terms of mechanical strength, etc. Preferred fibers are from about ¼ inch in length and about 1 micron in diameter.

Another component of the slurry may be ceramic microparticles, preferably glass microballoons, many types of which are commercially available in many sizes and are generally hollow spheres, made from various types of glass compositions with various wall thicknesses, usually in the size of about 5 to 200 microns in diameter. Solid spheres or diatoms may also be utilized in place of or in addition to the hollow microballoons. As in the case of the fibers, the size of the microballoons will in part determine the mechanical strength and physical characteristics of the composite. Preferably, the microballoons should be in a range of about 5 to 50 microns, which appears to be the preferred size for filling the voids which would otherwise exist between the fibers, thus increasing the strength of the composite. In some cases the slurry may contain microballoons and/or diatoms without fibers.

Also, diatoms (porous silica inner support structures of certain marine and fresh water algae) may be added to the slurry. The extremely fine porosity of the diatoms may increase mechanical strength while also increasing the bulk porosity, if desired. The diatoms may comprise up to 100% of the combined weight of the fibers and microparticles (microballoons and diatoms).

Typically, an aqueous slurry of the ceramic fibers and microballoons and/or diatoms is mixed to provide a substantially uniform dispersion. The concentration of the slurry is not particularly critical. A useful slurry will comprise up to 10 ; wt % of the fibers, up to 10 wt % of the microballoons with the remainder being water. The slurry may contain from 0–99 wt % of ceramic fibers and from 1–100 wt % microparticles, based on the combined weight of fibers and microparticles.

An aqueous slurry of ceramic fibers is thoroughly mixed to provide a substantially uniform dispersion of the fibers. The slurry will preferably comprise from up to about 10 weight percent alumino-silicate fibers, but other fibers of silica, alumina, boroaluminasilica (commercially available under the trademark Ultrafiber®440 from 3M Company), zirconia, silicon nitride, or mixtures thereof may be used at different concentrations, as desired. It may be desirable to use fibers of different materials to tailor the mechanical characteristics or density of the ceramic composite. For instance, a mat having distinct layers of alumina and aluminosilicate fibers would be useful at higher temperatures. Fibers of boroalumiasilica or of an alumina-zirconia mixture would reduce the density of the resulting ceramic composite without substantially affecting, for example, its insulation or temperature limit.

After the slurry has been thoroughly mixed, it is poured over a form-defining mold (usually porous enough to allow passage of the water therethrough but not the fibers or microballoons) which may be flat, irregular, curved, or virtually of any size or shape.

The water is then removed typically by vacuum through the porous mold thereby forming a wet mat.

Then, optionally, the mat may be secured by weaving or tying with a ceramic or glass thread. Such threads are commercially available. This may be desirable in order to provide a relatively even surface for application of the ceramic cloth.

Then the ceramic cloth is applied over the mat and, if desired, woven into the mat again using ceramic thread. The weaving may or may not be necessary depending upon the ultimate use of the ceramic composites, strength desired, etc. For example, if the ceramic composite is not intended to be exposed to severe mechanical stresses then the weaving of the cloth to the wet mat may not be unnecessary.

Then more of the fiber slurry (optionally containing microballoons) is applied over the ceramic cloth to form a fiber mat over the cloth, thereby forming a sandwich of the fiber cloth between two fiber mats. The wet mat is then molded, preferably by the vacuum removal of the excess water, as described above.

In a particularly preferred embodiment of the invention, the cloth utilized is larger than the upper and lower fiber mats between which it is sandwiched so that a portion of the cloth extends beyond the periphery of the mat. This flap of cloth will provide a means for attaching the final ceramic product to adjacent ceramic pieces, substrates, structural pieces, etc.

Then the process of applying a ceramic cloth in a fiber mat may be repeated as desired to obtain the required thickness of the overall mat and number of reinforcing cloths which are desired. Of course, the thickness of each of the fiber interlayers between the fiber cloth may be varied by thereby altering the mechanical, dielectric properties, etc. of the mat, as desired.

The mat is then dried, usually at a temperature of up to about 200° F., to remove the water. Duration of the drying will, of course, depend upon the size and shape of the mat. Then, a sol-gel binder is introduced, usually in incremental stages, although a single stage application may be utilized in some instances. The binder is preferably an alumina sol-gel glass that can be prepared by known techniques, such as those disclosed in our prior application. Other sol-gel glasses may be utilized, such as silica sol-gel glass or sol-gel glass of similar compositions to the particular fiber in the mat. Incremental addition of the binder involves repeating the steps of impregnating the mat with the binder, gelling the binder and curing the mat and binder. Usually a light coating of binder is applied in the first stage followed by an air dried gelation to dimensionally stabilize the fiber mat. Thereafter, the steps of impregnating, gelling and curing are repeated one or more times until the total desired amount of binder has been added. Typically about 15 to 300 wt % of binder is used based on the initial weight of fibers and microballoons in the mat. The impregnating step may be accomplished by wicking, spraying, vacuum infiltrating, and the like. Spraying is preferred. After impregnation, the binder is converted to a rigid gel, usually by air drying or by subjecting the binder-impregnated mat to an atmosphere of ammonia gas. Since the ammonia-sol reaction is exothermic, there is a tendency for bubbles to form in the mat which can be avoided, however, by allowing the first batch of binder to gel in air. Thereafter, the trapped bubbles are not a problem and ammonia gelation can be used.

After gelling the binder, the mat is cured, preferably by heating to about 200° F. for several hours (about four hours are preferred), then by slowly increasing the temperature to about 600° F. for a longer period of time (usually about five hours), and finally by rapidly reducing the temperature (quenching).

In addition to the ceramic fibers and microballoons, the slurry may also contain additives which can alter the physical characteristics of the composite. For example, by adding small ceramic whiskers (about 0.4 to 1 micron in diameter, 100:1 aspect ratio average) in small amounts (usually about 5 to 30% by weight of the slurry), the compression strength and modulus of the composite may be increased. Whiskers of silicon carbide of about 0.4 to 1 micron in diameter are useful for this purpose.

The final ceramic composite may also be coated with glass, metals, metal oxides, and the like, if desired. For example, this may be accomplished by brushing a water slurry of Pyrex®glass powder (−325 mesh is a convenient size) on its surface, drying, preferably in air, in an oven at about 160° F., and firing the composite at about 2000° F. This forms a layer of Pyrex®glass on the surface of the composite. Other methods of applying Pyrex®glass to the surface include fusing the glass to the composite surface by torch, plasma spray, laser rastering, etc. Pyrex®glass may also be applied to the composite by the method disclosed in copending, commonly assigned application Serial No. 212, 397, filed Jun. 27, 1988, which is incorporated herein by reference, in which a mixture of colloidal silica, boroaluminasilica powder, single crystal whiskers (such as silicon carbide or silicon nitride) and trona are mixed with Pyrex®glass powder and applied as a slurry onto the composite. The coating may be dried and fired as described above.

Referring to the figures, in FIG. 1 there is shown the steps for a preferred method for making the composite ceramic according to the present invention. In step 10, a slurry of ceramic fibers in water, optionally containing glass microballoons, is prepared. This slurry is then applied in step 11 to a porous mold and a vacuum is applied to the mold to form the wet fibrous mat. Optionally, in step 12 the mat is secured with a glass or ceramic thread. In step 13 a ceramic cloth is applied over the mat. In step 14 more of the slurry is applied over the cloth. If desired, edges of the cloth are left exposed to provide a means for attaching the ceramic to a substrate. Then, steps 11, 12, 13 and 14 are optionally repeated as many times as desired, depending on the desired number of fiber mat layers and reinforcing cloths. In step 15 the entire mat, including the cloths, are dried by heating. In step 16 the mat, including the cloths, is soaked with a sol-gel ceramic precursor and in step 17, the sol-gel is gelled and heat-cured to solidify the ceramic composite. Thereafter, the soaking in sol-gel, gelling and heat curing (steps 16 and 17) are repeated as necessary. In step 18 a glass binder or overcoat is applied to the completed composite, if desired. This produces a ceramic fabric reinforced fiber ceramic composite according to the present invention.

In FIG. 2 there is shown an apparatus and its use to form a cylindrical ceramic composite according to the present invention. Referring to FIG. 2A, a hollow drum 20 is shown having solid ends 21 and 22 with a porous cylindrical surface 23. The interior of the drum can be subjected to vacuum through opening 24. Referring to FIG. 2B, the porous drum 20 is immersed into a tank 25 containing the fiber (and microballoon) containing slurry. A vacuum is applied to end 24. While still applying the vacuum, referring to FIG. 2C, the drum 20 is withdrawn from the tank 25 and the vacuum is continued until the fiber mat 26 is firmly in place. Referring to FIG. 2D, the fiber mat 26 is then held in place by winding or weaving a glass or other fiber thread 27 around the mat 26. Referring to FIG. 2E, the ceramic reinforcement cloth 29 is then wrapped around the fiber mat 26.

Referring to FIG. 2F, to add additional layers of fiber mat, the entire drum 20, mat 26 and ceramic reinforcement cloth 29 are then reimmersed into tank 25 and the vacuum is applied as described above to add another fiber layer. The wrapping or weaving with glass thread, binding the ceramic reinforcement cloth and reimmersing in the tank 25 are then repeated until the desired thickness and number of cloth layers are attained.

Thereafter, the entire mat, including the reinforcement cloths, are dried, the sol-gel applied, gelled and cured as described above.

Referring to FIG. 3A there, is shown a form for making the leading edge of a airfoil according to the present invention. The tool 30 is hollow and has solid sides 31A and back 31B with porous upper and lower surfaces 31. An inlet 32 for applying a vacuum to the interior of the form 30 is provided. This form can be used as described in FIG. 2 to make a single mat composite 34 (FIG. 3B) or multiple fiber mat composite 35 (FIG. 3C) wherein desired portions of the mat are selectably reinforced with the reinforcement cloth 33. Reinforcement cloth may be, for example, glass cloth, graphite cloth, or a cloth which may be chosen for other characteristics, such as electrical characteristics.

While preferred embodiments have been shown and described, those skilled in the art will recognize modifications, variations, or alternatives that can be made without departing from the invention. The examples are provided to illustrate the invention and are not meant to limit it. Therefore, the specification and claims should be interpreted broadly to protect the invention here described. The claims should be limited only as is necessary in light of the pertinent prior art.

What is claimed is:

1. A process for forming a reinforced ceramic composite, comprising the steps of:

(a) forming at least one slurry comprising ceramic fibers and, optionally, ceramic microparticles;

(b) molding said slurry to form a felt mat;

(c) optionally, securing said mat with glass or ceramic thread;

(d) applying a ceramic reinforcement cloth upon said mat;

(e) applying more of said slurry over said cloth and molding as in step (b) and repeating steps (c) and (d);

(f) drying said mat formed in steps (b) and (e);

(g) impregnating said mat from step (f) with a portion of a sol-gel binder;

(h) gelling said binder so that said reinforcing cloth and mat are dimensionally stabilized;

(i) curing the gelled binder;

(j) optionally, repeating each of steps (g), (h) and (i);

(k) optionally applying a glass coating to said cured, dimensionally stabilized composite.

2. A process according to claim 1 wherein said ceramic fibers are selected from the group consisting of aluminosilicate, silica, alumina, boroaluminasilica, zirconia, silicon nitride, silicon carbide, and mixtures of any two or more thereof.

3. A process according to claim 1 wherein said sol-gel binder comprises an alumina sol-gel.

4. A process according to claim 2 wherein said fibers comprise aluminosilicate.

5. A process according to claim 1 wherein said step (h) comprises drying said sol-gel in air.

6. A process according to claim 1 wherein said step (h) comprises gelling said sol-gel with ammonia gas.

7. A process according to claim 1 wherein said step (i) comprises heating at a temperature of at least about 200° F. for about several hours, heating at a temperature of at least about 600° F. for several hours, and quenching to about room temperature.

8. A process according to claim 1 wherein said step (k) comprises applying a glass powder slurry over said composite, drying and firing at a temperature of about 2000° F.

9. A process according to claim 8 wherein said slurry further comprises colloidal silica, boroaluminasilica, single crystal ceramic whiskers and trona.

10. A process according to claim 1 wherein said microparticles comprise glass microballoons.

11. A process according to claim 1 wherein said microparticles comprise diatoms.

\* \* \* \* \*

UNITED STATES PATENT AND TRADEMARK OFFICE
CERTIFICATE OF CORRECTION

PATENT NO.         : 5,569,343

DATED              : October 29, 1996

INVENTOR(S)        : Garrigus

It is certified that error appears in the above-identified patent and that said Letters Patent is hereby corrected as shown below:

Title page, References Cited, please insert the following:

```
1,477,686   12/18/23   Braender
2,379,126   6/26/45    Welden
2,840,259   6/24/58    Steidl
2,927,711   3/8/60     Naggiar
4,624,271   2/10/89    Rice
4,828,774   5/9/89     Andersson
4,849,276   7/18/89    Bendig
5,000,998   3/19/91    Bendig
5,009,822   4/23/92    Sacks
5,021,369   6/4/91     Ackerman
```

Title page, Other Publications, please insert the following:

NASA Tech Brief April 89, p.88 "Surface Tension Confines Cryogenic Liquid", Goddard Space Flight Center.
NASA Tech Brief Nov.89, p.52 "Ceramic Wick for Capillary-Pump Heat Pipe", Goddard Space Flight Center.
NASA Tech Brief Sept.89, p.84 "Capillary-Pumped Heat-Transfer Loop," Marshall Space Flight Center.

Column 3, line 27, change "10;wt %" to read --10 wt %--.
Column 5, line 66, change "3A there," to read --3A, there--.
Column 5, line 67, change "of a airfoil" to read --of an airfoil--.

Signed and Sealed this

Tenth Day of February, 1998

*Attest:*

BRUCE LEHMAN

*Attesting Officer*     *Commissioner of Patents and Trademarks*